(12) United States Patent
Nakajima et al.

(10) Patent No.: US 6,635,996 B1
(45) Date of Patent: Oct. 21, 2003

(54) PLASMA GENERATING APPARATUS, PLASMA GENERATING METHOD AND GAS PROCESSING METHOD BY PLASMA REACTION

(75) Inventors: Ikuo Nakajima, Tokyo (JP); Toshiji Nishiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/534,336

(22) Filed: Mar. 24, 2000

(30) Foreign Application Priority Data

Mar. 26, 1999 (JP) .............................. 11-083496
Jan. 25, 2000 (JP) ....................... 2000-015675

(51) Int. Cl.$^7$ ................................................ H01J 7/24
(52) U.S. Cl. ................... 315/111.21; 313/118
(58) Field of Search ................ 315/111.21, 111.51, 315/169.1; 219/121.41; 117/104; 313/118

(56) References Cited

U.S. PATENT DOCUMENTS

| | | | |
|---|---|---|---|
| 3,614,511 A | * 10/1971 | Baker | 313/220 |
| 5,440,876 A | 8/1995 | Bayliss et al. | 60/274 |
| 5,789,867 A | * 8/1998 | Westendorp et al. | 315/111.21 |
| 5,814,149 A | * 9/1998 | Shintani et al. | 117/104 |
| 5,863,324 A | * 1/1999 | Kobashi et al. | 117/89 |
| 5,968,377 A | * 10/1999 | Yuasa et al. | 219/121.41 |

FOREIGN PATENT DOCUMENTS

| | | |
|---|---|---|
| JP | 63-267419 | 11/1988 |
| JP | 2-131120 | 5/1990 |
| JP | 6-241019 | 8/1994 |
| JP | 8-321397 | 12/1996 |
| JP | 10-000325 | 1/1998 |

OTHER PUBLICATIONS

"Byproduct Identification and Mechanism Determination in Plasma Chemical Decomposition of Trichloroethylene," S. Futamura and T. Yamamoto, IEEE Transactions on Industry Applications, vol. 33, No. 2, 447–453 (1997).

* cited by examiner

Primary Examiner—Don Wong
Assistant Examiner—Jimmy T Vu
(74) Attorney, Agent, or Firm—Fitzpatrick, Cella, Harper & Scinto

(57) ABSTRACT

A plasma generating apparatus comprises a pair of electrodes consisting of an electrode connected to an AC power source and a grounded electrode. An inorganic dielectric substance containing barium titanate as a principal component is filled between the electrodes. It is possible to generate a stable and uniform glow discharge under the atmospheric pressure at low cost by applying a considerably low voltage between said electrodes.

16 Claims, 4 Drawing Sheets

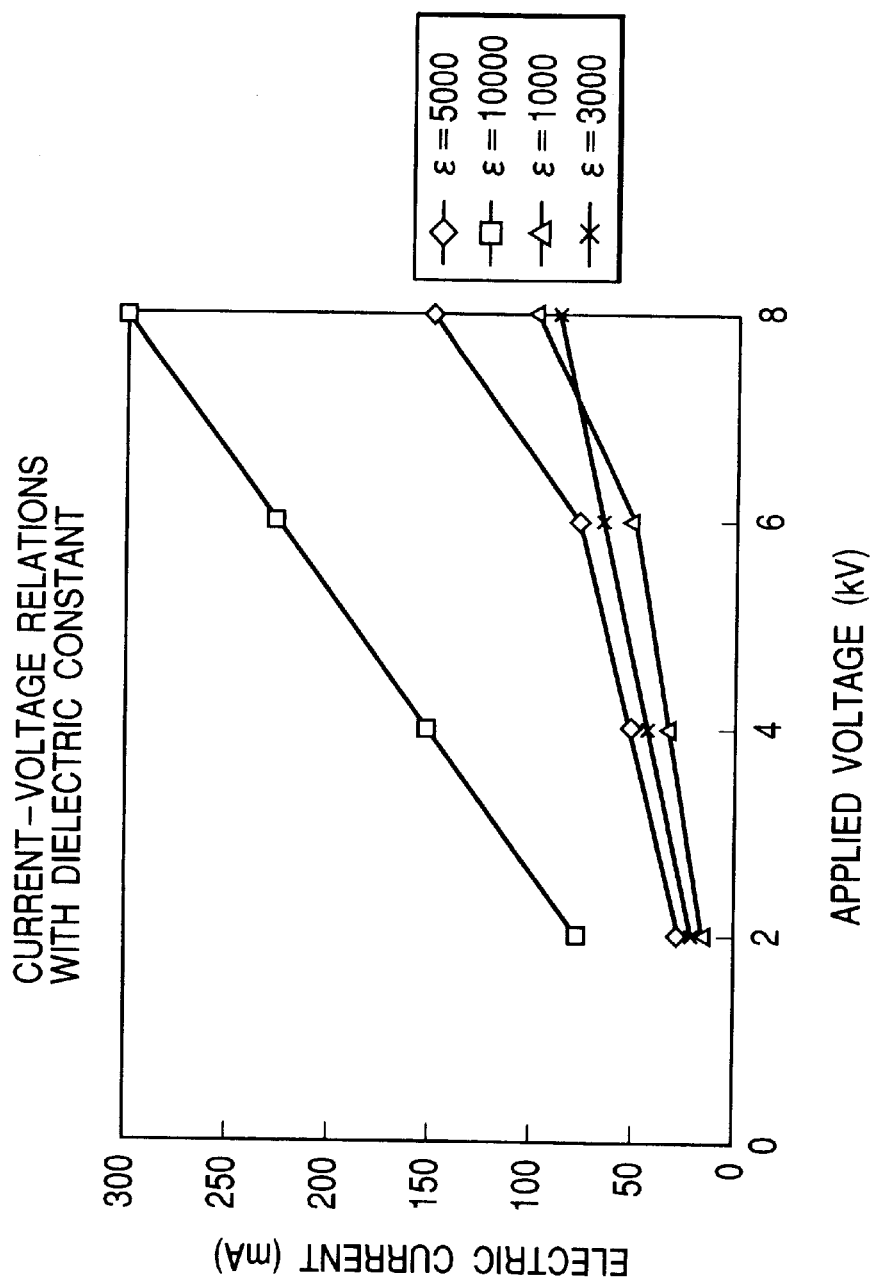

PLASMA GENERATING APPARATUS, PLASMA GENERATING METHOD AND GAS PROCESSING METHOD BY PLASMA REACTION

BACKGROUND OF THE INVENTION

1. Field of the Invention

This invention relates to a plasma generating apparatus and a plasma generating method. More particularly, the present invention relates to a plasma generating apparatus which can generate a stable and uniform glow discharge even in the air under the atmospheric pressure and also to a plasma generating method using such an apparatus.

2. Related Background Art

Various techniques have been developed to generate electric discharges under the atmospheric pressure. Such techniques are generally categorized as the silent discharge, the creeping discharge, the pulse corona discharge and so on. (The silent discharge is known as an ozone generator.) The creeping discharge is a technique in which electrodes are formed respectively on the surface and in the inside of an inorganic substance typically made of a ceramic material and then an electric discharge is generated on the surface of the ceramic material by applying an AC electric field between the electrodes. The pulse corona discharge is a technique of generating a corona discharge in an inter-electrode space by applying an ultra-short pulse high voltage with a half width of 50 to 500 nsec, which has a quick plasma rising time of 10 to 50 nsec at the electrodes.

However, the above listed known discharge apparatus and discharge methods can be accompanied by the following problems.

The silent discharge requires the use of a large number of reactors in order to establish a stable electric discharge in volumes of gas because the gap separating the electrodes of the discharge apparatus is as small as several millimeters.

The creeping discharge takes place only within a highly limited area.

The pulse corona discharge requires the use of a discharge apparatus whose power source and electrodes are costly.

There has also been proposed a technique of stably generating a glow discharge under the atmospheric pressure by means of specifically designed electrodes for the discharge apparatus. However, the proposed technique requires the use of helium or argon gas that is costly and can generate a stable glow discharge only in a limited area under the atmospheric pressure.

SUMMARY OF THE INVENTION

In view of the above problems of the known discharge techniques, it is therefore an object of the present invention to provide an apparatus and a method that can stably generate a plasma discharge at low cost and also a gas processing method using a plasma reaction. Another object of the present invention is to provide an apparatus and a method that can stably generate a plasma discharge under atmospheric pressure without using costly helium or argon gas as well as a low cost gas processing method using a plasma reaction for decomposing organic compounds or the like that are ordinarily hardly decomposed.

According to the present invention, the above objects are achieved by providing a plasma generating apparatus comprising a pair of electrodes of an electrode connected to an AC power source and a grounded electrode, in which an inorganic dielectric substance containing barium titanate as a principal component is filled between the electrodes.

According to the present invention, there is also provided a plasma generating apparatus comprising a pair of electrodes of an electrode connected to an AC power source and a grounded electrode, in which an inorganic dielectric substance with a dielectric constant between 1,000 and 10,000 is filled between the electrodes.

In another aspect of the present invention, there is provided a plasma generating method comprising steps of filling an inorganic dielectric substance containing barium titanate as a principal component between a pair of electrodes of an electrode connected to an AC power source and a grounded electrode, introducing a gas between the electrodes and applying an AC electric field between the electrodes by means of the AC power source to generate a glow discharge under the atmospheric pressure.

According to the invention there is also provided a plasma generating method comprising steps of filling an inorganic dielectric substance with a dielectric constant from 1,000 to 10,000 between a pair of electrodes of an electrode connected to an AC power source and a grounded electrode, introducing a gas between the electrodes and applying an AC electric field between the electrodes by means of the AC power source to generate a glow discharge under the atmospheric pressure. For the purpose of the invention, the gas contains air as a principal ingredient and may contain an organic compound or a chlorine-containing organic compound.

In still another aspect of the present invention, there is provided a gas processing method comprising the steps of filling an inorganic dielectric substance containing barium titanate as a principal component between a pair of electrodes of an electrode connected to an AC power source and a grounded electrode, introducing a gas containing an organic compound between the electrodes and applying an AC electric field between the electrodes by means of the AC power source to generate a glow discharge under the atmospheric pressure, thereby decomposing the organic compound.

According to the invention, there is also provided a gas processing method comprising the steps of filling an inorganic dielectric substance with a dielectric constant from 1,000 to 10,000 between a pair of electrodes of an electrode connected to an AC power source and a grounded electrode, introducing a gas containing an organic compound between the pair of electrodes and applying an AC electric field between the electrodes by means of the AC power source to generate a glow discharge under the atmospheric pressure, thereby decomposing the organic compound.

Thus, a plasma generating apparatus, a plasma generating method and a gas processing method utilizing a plasma reaction of the present invention can generate a glow discharge under the atmospheric pressure by filling the inorganic dielectric substance between a pair of electrodes.

Additionally, when a granular inorganic dielectric substance is used, gaps are produced among the granules of the inorganic dielectric substance, which makes it possible to stably generate a uniform glow discharge with a low power consumption rate even if the gas is oxygen or nitrogen that requires a high firing voltage because the gaps are considerably small. Thus, it is no longer necessary to use costly gas such as helium or argon.

Still additionally, according to the invention, an electric discharge occurs in every gaps among the granules of the inorganic dielectric substance. Then, it is no longer necessary to use a large number of reactors. Furthermore, a plasma generating apparatus according to the invention can be manufactured at low cost because it can generate an electric discharge by means of an AC power source with a commercial frequency of 50 Hz.

Furthermore, according to the invention, a gas containing an organic compound that can be hardly decomposed by any known ordinary gas processing method can easily be decomposed into substances that are safe and can be treated with ease, by using the plasma reaction.

BRIEF DESCRIPTION OF THE DRAWINGS

FIG. 5 is a graph showing a relationship between electric current and applied voltage in terms of dielectric constant.

DETAILED DESCRIPTION OF THE PREFERRED EMBODIMENTS

Referring to the accompanying drawings, the present invention will hereinafter be described in detail.

Figure 1:
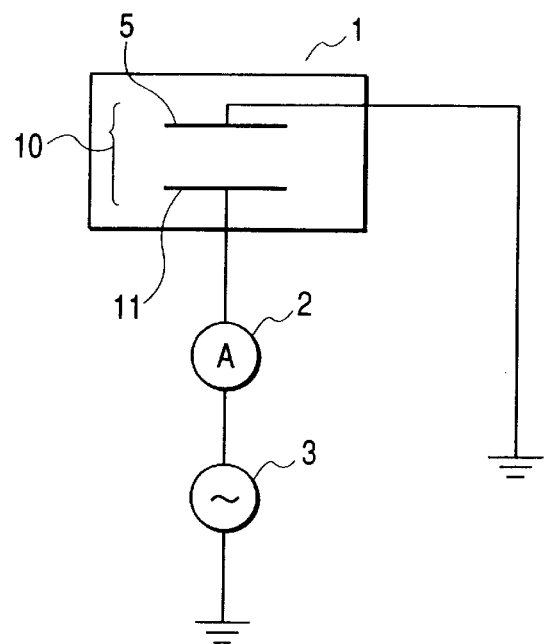
FIG. 1 is a circuit diagram of an embodiment of a plasma generating apparatus according to the invention.

FIG. 1 is a circuit diagram of an embodiment of a plasma generating apparatus according to the invention. It comprises a reactor 1 provided with a pair of electrodes 10 including a grounded electrode 5 and an electrode 11 connected to an AC power source 3. Additionally, an ammeter 2 is connected between the reactor 1 and the AC power source 3 in order to detect the electric discharge that occurs in the reactor 1. Although a frequency required for the AC power source 3 to generate a desired electric discharge is not particularly limited, a commercial frequency such as 50 Hz or 60 Hz can be used for it. Alternatively, a high frequency of the order of mega hertz (e.g., RF frequency of 13.56 MHz) can also be used for it.

Figure 2:
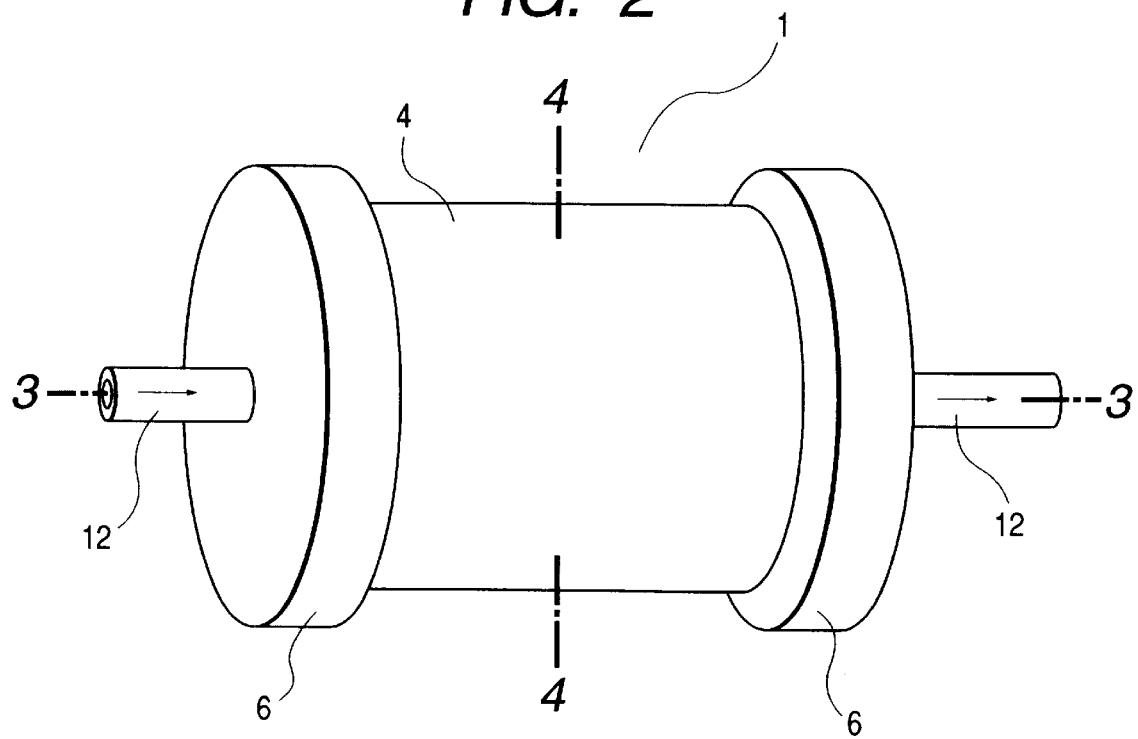
FIG. 2 is a schematic perspective view of a reactor which constitutes a plasma generating apparatus according to the invention.

FIG. 2 is a schematic perspective view of a reactor which constitutes a plasma generating apparatus according to the invention. Referring to FIG. 2, the reactor 1 has a reaction tube electrode 4, being one of the electrodes, connected to an AC power source (not shown). The other electrode of the electrodes is a grounded electrode arranged in the reactor 1. The reactor 1 additionally has a gas pipe 12 for leading gas into and out of the reactor 1. The arrows in FIG. 2 indicate the gas flow path of the reactor.

In FIG. 2, the reactor 1 is formed of a pair of outer flanges 6 and the reaction tube electrode 4. The outer flanges 6 are tightly held in contact with the reaction tube electrode 4 to prevent a gas leak out of the reaction tube electrode 4. The outer flanges 6 have a central bore for allowing a gas pipe 12 to run therethrough. The reaction tube electrode 4 is an electric conductor or that arranged on the inner surface of the reactor 1. It is advantageously made of SUS, copper, brass, iron, aluminum, tungsten or nickel. The outer flanges 6 are electric insulators typically made of an organic material such as nylon, vinyl chloride, Teflon, polyethylene, PET, polyimide, polysulfone or epoxy or an inorganic material such as glass or ceramics.

Figure 3:
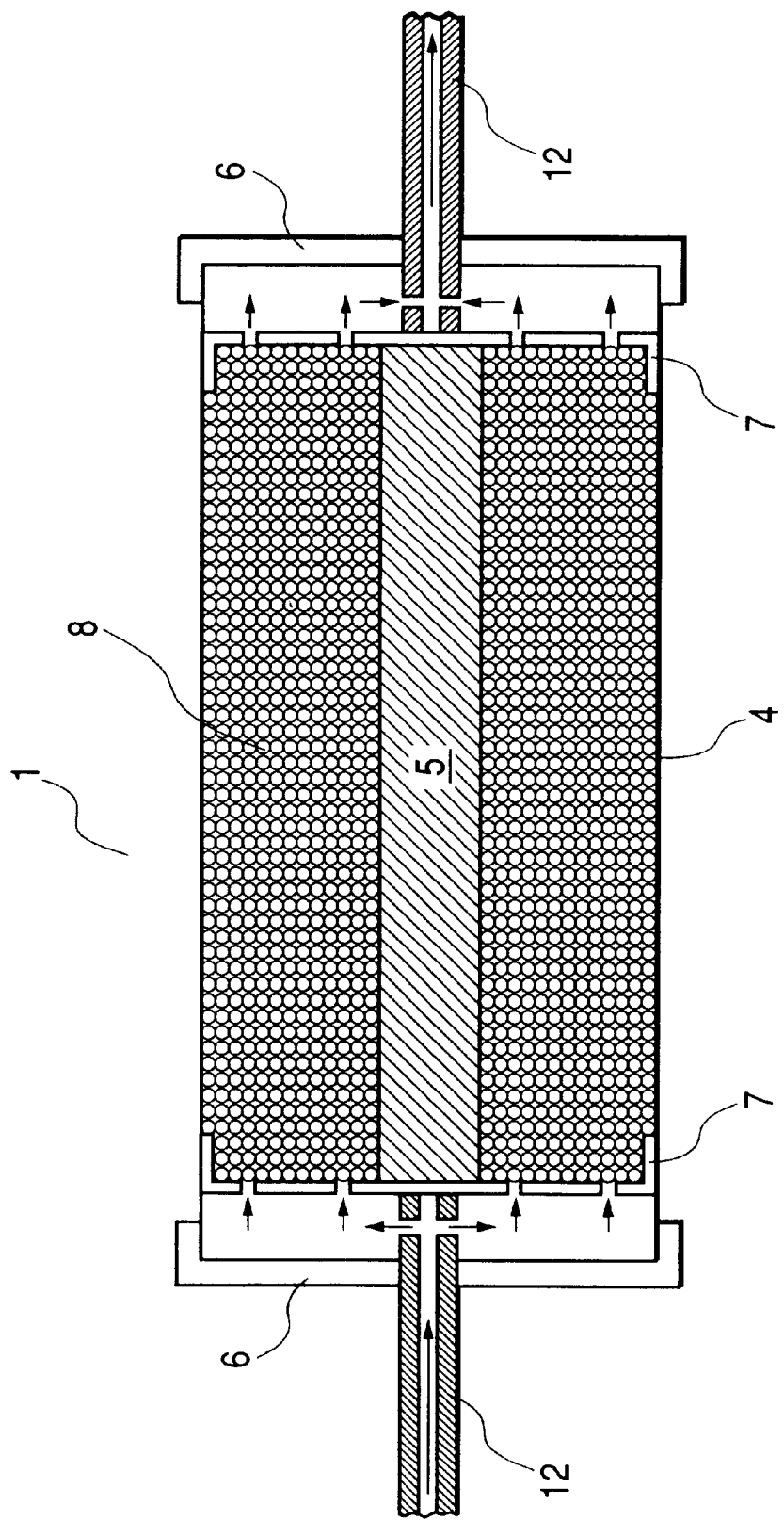
FIG. 3 is a schematic cross sectional view of the reactor of FIG. 2 taken along line 3—3 in FIG. 2.

FIG. 3 is a schematic cross sectional view of the reactor of FIG. 2 taken along line 3—3 in FIG. 2. Inner flanges 7 are arranged within the reactor 1. The inner flanges 7 also have a central bore for allowing a gas pipe 12 to run therethrough.

The inner flanges 7 are electric insulators typically made of an organic material such as nylon, vinyl chloride, Teflon, polyethylene, PET, polyimide, polysulfone or epoxy or an inorganic material such as glass or ceramics.

In FIG. 3, reference number 8 denotes an inorganic dielectric substance that is advantageously in the form of granules and filled in the space defined by the two inner flanges 7, the reaction tube electrode 4 and the grounded electrode 5. Preferably, the inorganic dielectric substance 8 is densely filled in the space, which makes it possible to stably generate an electric discharge. Preferably, the inorganic dielectric substance 8 has a dielectric constant between 1,000 and 10,000. Preferably, it contains barium titanate as a principal component. The inorganic dielectric substance containing barium titanate as a principal component includes barium titanate itself and a material obtained by adding $TiO_2$, $SiO_2$, $Al_2O_3$ or $Bi_2O_3$ or a combination of any of them to barium titanate $BaTiO_3$. While the size of the granules of the inorganic dielectric substance 8 may vary depending on the application, it is preferably between 0.1 mm and several tens of millimeters in terms of the length of the axial line passing through the center of gravity of the granule. More preferably, it is between 0.1 mm and 50 mm. The profile of the granules may be spherical, pellet-shaped, square-shaped or irregular-shaped.

Although the mechanism of the phenomenon that appears when an AC electric field is applied between the reaction tube electrode 4 and the grounded electrode 5 is not clear, the inventors of the present invention presume that polarization occurs among the granules of the inorganic dielectric substance 8 to generate a pulse-like micro-discharge having a duration in the order of nano seconds, so that the gas confined in the gaps defined by the granular inorganic dielectric substance 8 is turned, at least partly, into plasma by the micro-discharge. Since the gaps are considerably small a uniform discharge can be stably generated in the apparatus under the atmospheric pressure with low applied power even in a gas such as oxygen or nitrogen that normally has a very high firing voltage.

A large number of pores having a diameter between 1 mm and 2 mm are formed in the area of the inner flanges 7 in contact with the inorganic dielectric substance 8 so that gas can freely flow therethrough.

The grounded electrode 5 is an electric conductor that is advantageously made of SUS, copper, brass, iron, aluminum, tungsten or nickel. A gas pipe 12 is connected to each of the opposite ends of the grounded electrode 5 typically by welding. The gas pipe 12 may be either an electric conductor or an electric insulator. The grounded electrode 5 and the gas pipe 12 is electrically connected to each other when the gas pipe 12 is made of an electrically conductive material selected from SUS, copper, brass, iron, aluminum, tungsten and nickel. Then, the grounded electrode 5 and the gas pipe 12 may be integrally formed, and then the electrode 5 can be grounded by grounding the gas pipe 12.

With an alternatively arrangement, the grounded electrode 5 is connected to an AC power source, so as to ground the reaction tube electrode 4. Then, if a high frequency power source is used for the AC power source, the grounded reaction tube electrode 4 operates to prevent any leakage of electromagnetic waves. With this arrangement, the gas pipe 12 is advantageously made of an insulating material in order to effectively prevent any leakage of electromagnetic waves.

The portion of the gas pipe 12 between the outer flange 6 and the inner flange 7 is provided with pores having a diameter between 1 mm and 2 mm for allowing gas to pass therethrough.

Gas flows into the reactor 1 by way of one of the gas pipe 12. Then, it flows into the inner space filled with the inorganic dielectric substance 8 by way of the pores of the gas pipe 12 and those of the inner flange 7. After passing through the inorganic dielectric substance 8, the gas flows out of the reactor 1 by way of the pores of the other inner flange 7 and those of the other gas pipe 12.

When an AC electric field is applied between the reaction tube electrode 4 and the grounded electrode 5 while gas remains in the gaps defined by the granules of the inorganic dielectric substance 8, a glow discharge is generated in the gaps. Thereby, the inorganic compound contained in the gas can be decomposed, and thus the apparatus can be used to process waste gas. The organic compound to be decomposed may be a chlorine-containing compound.

Figure 4:
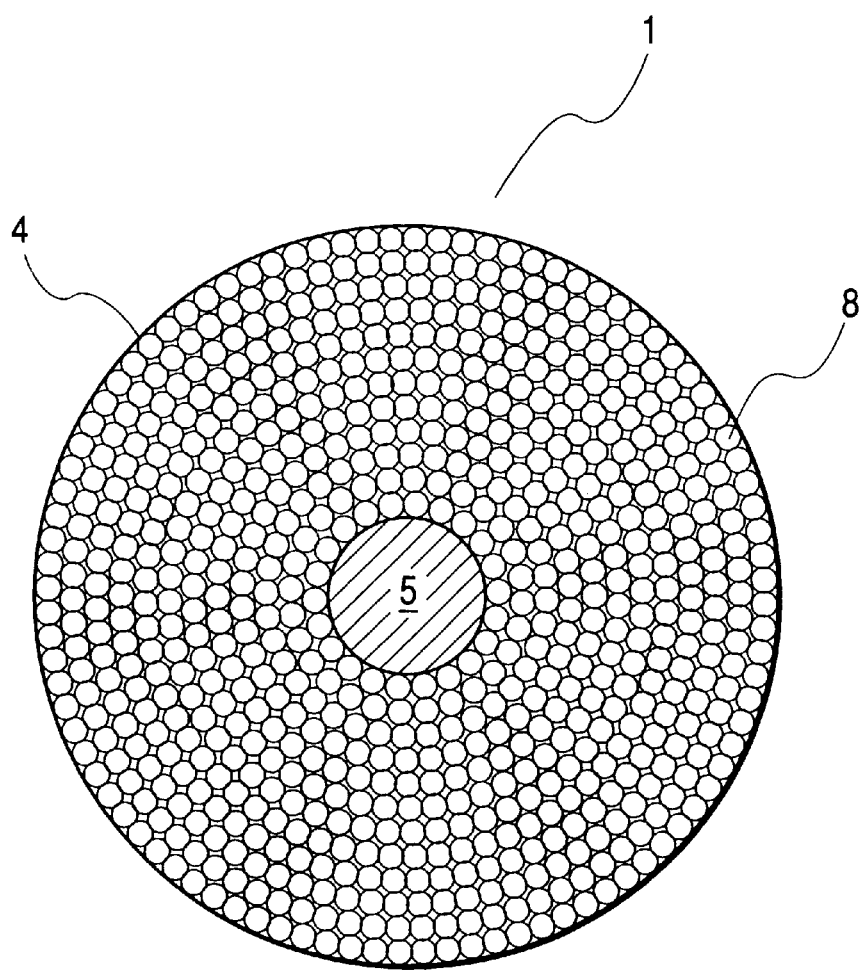
FIG. 4 is a schematic cross sectional view of the reactor of FIG. 2 taken along line 4—4 in FIG. 2.

FIG. 4 is a schematic cross sectional view of the reactor of FIG. 2 taken along line 4—4 in FIG. 2. As seen from FIG. 4, the grounded electrode 5, the inorganic dielectric substance 8 and the reaction tube electrode 4 are arranged from the center of the cylinder toward the outside in the listed order.

Now, the present invention will be described in greater detail by way of examples, although the present invention is by no means limited thereto.

EXAMPLE 1

A plasma generating apparatus having a configuration as described above by referring to FIGS. 1 through 4 comprised the reaction tube electrode 4 made of SUS having an inner diameter of 80 mm$\phi$ and a length of 300 mm, the grounded electrode 5 made of SUS having an outer diameter of 40 mm$\phi$, the gas pipe 12 made of SUS, the outer flange 6 made of Teflon and the inner flange 7 made of Teflon. The inorganic dielectric substance 8 was a granule of barium titanate having a dielectric constant of 5,000 and a diameter of 2 mm$\phi$, which was filled into the space inside the apparatus in an amount of about 200 g. Dry air was used as a gas flowing at a rate of 500 ml/min. An electric discharge occurred when an AC electric field was applied between the reaction tube electrode 4 and the grounded electrode 5 with a frequency of 50 Hz and a voltage of 4 kV; the ammeter showed an electric current of 50 mA. Thus, it was proved in the example that plasma was generated in a gas having a high firing voltage such as air.

Comparative Example 1

The AC electric field was applied between the electrodes as in Example 1 except that the reactor 1 was not filled with the inorganic dielectric substance 8. However, the ammeter did not show any electric current to prove that no electric discharge took place.

Comparative Example 2

The procedure of Example 1 was followed except that pellets of aluminum oxide ($Al_2O_3$) having a dielectric constant of 10 and a diameter of 2 mm$\phi$ were used for the inorganic dielectric substance 8. Then, the AC electric field was applied between the electrodes. However, the ammeter did not show any electric current to prove that no electric discharge took place.

EXAMPLE 2

The procedure of Example 1 was followed except that barium titanate having a dielectric constant of 10,000 was used for the inorganic dielectric substance 8. Then, the AC electric field was applied between the electrodes. An electric discharge then took place so that the ammeter showed an electric current of 150 mA.

EXAMPLE 3

The procedure of Example 1 was followed except that barium titanate having a dielectric constant of 1,000 was used for the inorganic dielectric substance 8. Then, the AC electric field was applied between the electrodes. An electric discharge then took place so that the ammeter showed an electric current of 30 mA.

EXAMPLE 4

The procedure of Example 1 was followed except that barium titanate having a dielectric constant of 3,000 was used for the inorganic dielectric substance 8. Then, the AC electric field was applied between the electrodes. An electric discharge then took place so that the ammeter showed an electric current of 40 mA.

Table 1 below summarily shows the results obtained by Examples 1 through 4 and Comparative Examples 1 and 2.

Barium titanate was used for the inorganic dielectric substance 8 is that the occurrence of an electric discharge was confirmed in each of Examples 1 through 4. However, no electric discharge took place in Comparative Example 1, where no inorganic dielectric substance 8 was filled in the reactor 1. In Comparative Example 2, aluminum oxide having a dielectric constant of 800 was used for the inorganic dielectric substance 8, so that no electric discharge took place.

EXAMPLE 5

An electric discharge was generated as in Example 1 using different types of barium titanate having respective dielectric constants of 1,000, 3,000, 5,000 and 10,000 for t he inorganic dielectric substance 8 with an applied voltage between 2 kV and 8 kV. Table 2 and FIG. 5 show the relationship between the applied voltage and the reading of the ammeter in terms of the dielectric constant in this Example. From FIG. 5, it has been found that the observed electric current is higher for the same applied voltage when the inorganic dielectric substance 8 has a higher dielectric constant. Thus, it can be expected that plasma with a higher energy is generated for the same applied voltage when the inorganic dielectric substance has a higher dielectric constant. The rise in the observed electric current is remarkable for the same applied voltage when the dielectric constant exceeds 5,000.

EXAMPLE 6

The procedure of Example 1 was followed except that air containing methanol with a content of 300 mg/l was used as a gas flowing into the reactor 1 at a rate of 5 liter/min. When the AC electric field was applied thereto, an electric discharge took place to generate plasma. The gases flowing out of the outlet port of the reactor 1 were analyzed by a gas chromatograph mass spectrometer to find the types and the concentrations of the gases. It was found that the methanol concentration had been reduced to 5 mg/l. Beside methanol, oxygen, nitrogen and carbon dioxide were also detected. Thus, it was proved that methanol was decomposed by the generation of plasma in this example.

EXAMPLE 7

The procedure of Example 1 was followed except that air containing dichloromethane with a content of 50 mg/l was used as a gas flowing into the reactor 1 at a rate of 1 liter/min. When the AC electric field was applied thereto, an electric discharge took place to generate plasma. The gases flowing out of the outlet port of the reactor 1 were analyzed by a gas chromatograph mass spectrometer to find the types and the concentrations of the gases. It was found that no dichloromethane existed there and hydrogen chloride, oxygen, nitrogen and carbon dioxide were detected in stead. Thus, it was proved that dichloromethane was decomposed by the generation of plasma in this example.

EXAMPLE 8

The procedure of Example 1 was followed except that air containing tetrachloroethylene with a content of 50 mg/l was used as a gas flowing into the reactor 1 at a rate of 1 liter/min. When the AC electric field was applied thereto, an electric discharge took place to generate plasma. The gases flowing out of the outlet port of the reactor 1 were analyzed by a gas chromatograph mass spectrometer to find the types and the concentrations of the gases. It was found that no tetrachloroethylene existed there and hydrogen chloride, oxygen, nitrogen and carbon dioxide were detected in stead. Thus, it was proved that dichloromethane was decomposed by the generation of plasma in this example.

In Examples 6, 7, 8, it was possible to reliably decompose, at low cost, organic compounds that can hardly be decomposed or that can be decomposed only at high cost by any known method into the decomposed products such as oxygen and nitrogen or the like that can be treated safely and easily.

TABLE 1

| | inorganic dielectric substance | dielectric constant $\epsilon$ | applied voltage (kV) | current (mA) |
|---|---|---|---|---|
| Example 1 | barium titanate | 5,000 | 4 | 50 |
| Example 2 | barium titanate | 10,000 | 4 | 150 |
| Example 3 | barium titanate | 1,000 | 4 | 30 |
| Example 4 | barium titanate | 3,000 | 4 | 40 |
| Comparative Example 1 | none | — | 4 | 0 |
| Comparative Example 2 | aluminum oxide | 10 | 4 | 0 |

TABLE 2

| applied voltage (kV) | $\epsilon = 1,000$ current (mA) | $\epsilon = 3,000$ current (mA) | $\epsilon = 5,000$ current (mA) | $\epsilon = 10,000$ current (mA) |
|---|---|---|---|---|
| 2 | 15 | 20 | 25 | 75 |
| 4 | 30 | 40 | 50 | 150 |
| 6 | 50 | 63 | 75 | 230 |
| 8 | 95 | 85 | 150 | 300 |

As described above, according to the invention, it is now possible to generate a stable and uniform glow discharge under the atmospheric pressure at low cost by applying a considerably low voltage, which is also possible using a gas containing air as a principal ingredient. Additionally, an organic solvent and a chlorine-containing organic solvent contained in air can be decomposed into the products such as oxygen, nitrogen and hydrogen chloride or the like that can be treated easily at low cost.

What is claimed is:

1. A plasma generating apparatus comprising:
   a reactor,
   a ground electrode provided to the reactor,
   an electrode connected to an AC power source and placed opposite and around the ground electrode,
   a space between the electrode connected to the AC power source and the ground electrode filled with an inorganic dielectric substance which has a plurality of gaps through which a gas can flow, and
   a flange which holds the inorganic dielectric substance in the space,
   wherein the ground electrode has an elongated shape along the direction of the gas flow and does not extend over the flange out of the space filled with the inorganic dielectric substance.

2. The plasma generating apparatus according to claim 1, wherein said inorganic dielectric substance has a dielectric constant between 1,000 and 10,000.

3. The plasma generating apparatus according to claim 1, wherein said inorganic dielectric substance is in the form of granules.

4. The plasma generating apparatus according to claim 1, wherein the profile of the granules is selected from the group consisting of spherical, pellet-shaped, square-shaped, and irregular-shaped profiles.

5. The plasma generating apparatus according to claim 1, wherein one of said electrodes connected to an AC power source is cylindrical.

6. The plasma generating apparatus according to claim 1, wherein said inorganic dielectric substance is barium titanate as a principal component.

7. A plasma generating method comprising the steps of:
   applying an AC electric field to an inorganic dielectric substance,
   wherein said inorganic dielectric substance is filled within a space of a plasma generating apparatus comprising:
   a reactor,
   a ground electrode provided to the reactor, and
   an electrode connected to an AC power source and placed opposite and around the ground electrode,
   the space between the electrode connected to the AC power source and the ground electrode filled with the inorganic dielectric substance which has a plurality of gaps through which a gas can flow, and
   a flange which holds the inorganic dielectric substance in the space,
   wherein the ground electrode has an elongated shape along the direction of the gas flow and does not extend over the flange out of the space filled with the inorganic dielectric substance.

8. The plasma generating method according to claim 7, wherein said inorganic dielectric substance has a dielectric constant between 1,000 and 10,000.

9. The plasma generating method according to claim 7, wherein said inorganic dielectric substance is in the form of granules.

10. The plasma generating method according to claim 7, wherein the profile of the granules is selected from the group consisting of spherical, pellet-shaped, square-shaped, and irregular-shaped profiles.

11. The plasma generating method according to claim 7, wherein one of said electrodes connected to an AC power source is cylindrical.

12. The plasma generating method according to claim 7, wherein said inorganic dielectric substance is barium titanate as a principal component.

13. The plasma generating method according to claim 7, wherein said gas contains air as a principal ingredient.

14. The plasma generating method according to claim 7, wherein said gas contains an organic compound.

15. The plasma generating method according to claim 7, wherein said gas contains a chlorine-containing organic compound.

16. The plasma generating method according to claim 7, wherein said AC electric field is applied under atmospheric pressure.

* * * * *